United States Patent

Smith et al.

[11] Patent Number: 5,264,788
[45] Date of Patent: Nov. 23, 1993

[54] ADJUSTABLE STRAP IMPLEMENTED RETURN LINE FOR A PROBE STATION

[75] Inventors: Kenneth R. Smith; K. Reed Gleason, both of Portland; Jeffrey A. Williams, Portland; Laura L. Spargur, Portland, all of Oreg.

[73] Assignee: Cascade Microtech, Inc., Beaverton, Oreg.

[21] Appl. No.: 898,015

[22] Filed: Jun. 12, 1992

[51] Int. Cl.$^5$ .................. G01R 31/02; H01R 4/66
[52] U.S. Cl. ................... 324/158 P; 324/72.5; 439/482
[58] Field of Search ........... 324/158 F, 158 P, 72.5; 439/482, 502, 98, 99; 267/69, 166

[56] References Cited

U.S. PATENT DOCUMENTS

| | | | |
|---|---|---|---|
| 3,256,484 | 6/1966 | Terry | 324/72.5 |
| 3,265,969 | 8/1966 | Catu | 324/72.5 |
| 4,838,802 | 6/1989 | Soar | 439/92 |
| 4,923,407 | 5/1990 | Rice et al. | 324/72.5 |
| 5,045,781 | 9/1991 | Gleason et al. | 324/158 P |

FOREIGN PATENT DOCUMENTS 1178872 7/1989 Japan.

OTHER PUBLICATIONS

Laass, H., Federal Republic of Germany, German Patent Publication (Offenlegungstag), Doc. No. 2912826, pub. date Oct. 16, 1980.

*Primary Examiner*—Vinh Nguyen
*Attorney, Agent, or Firm*—Chernoff, Vilhauer, McClung & Stenzel

[57] ABSTRACT

A return line for a probe station includes a sheet-like conductive strap having a first end connected electrically to a first probe and a self-coiling second end connected automatically detachably to a second probe, as by insertion of the second probe centrally within the coils of the second end. If the spacing between the probes exceeds a maximum distance, the strap harmlessly disconnects. The flat central portion of the strap automatically tracks any reductions in the spacing between the probes, which enables fast probe travel and minimizes noise pickup. Preferably a spindle rotatably engages the coiled probe and has a post member that carries the second end of the strap to a far side of the probe to improve tip visibility and electrical connection during close-in probing.

11 Claims, 4 Drawing Sheets

ADJUSTABLE STRAP IMPLEMENTED RETURN LINE FOR A PROBE STATION

BACKGROUND OF THE INVENTION

The present invention relates to an apparatus and method for implementing a return line of the type which are used with probe stations and, in particular, to an adjustable strap implemented return line of the type used, for example, to electrically interconnect the signal probe and ground probe of a high frequency probe station as well as a procedure for making the strap.

The testing of high-frequency electrical components is typically performed at a probe station. At the probe station, the device-under-test (DUT) is held temporarily, such as by vacuum pressure, on a table or so-called stage. The signal probe and ground probe are normally mounted above the stage, each by its own X-Y-Z positioner, so that each probe is capable of independent X-Y-Z movement across the measurement plane defined by the top surface of the device. This allows the tip of each probe to be moved between various measurement sites or ground sites on the DUT.

To enable proper transmission of high-frequency signals through the signal probe, the tip of the signal probe usually comprises a controlled-impedance structure having a signal line conductor and ground line conductor in predetermined closely-spaced arrangement to each other. In order to return the ground line conductor of the signal probe to the ground of the DUT, a separate return line is used since the spacing between the measurement site and the nearest ground site on the DUT is typically variable and often is much larger than the spacing between the signal line and ground line conductors on the tip of the signal probe. The desirability of using a sheet-like strap as a return line for a high-frequency probe is recognized in several references including Gleason et al. U.S. Pat. No. 5,045,781, Soar U.S. Pat. No. 4,838,802, and Japanese Patent Publication No. 1-178872 by Chiyojima published Jul. 17, 1989.

Gleason shows a rigid strap extending in cantilevered position from the ground probe for wiping engagement across the outer conductor of the signal probe. In this setup, typically there will be an unused portion of strap extending past the signal probe where the length of this unused portion is many times larger than the tip-to-tip separation between the probes. This occurs because the majority of probing is typically performed close-in, that is, with the tips of the signal and ground probes separated by distances which do not exceed 0.010 inches, whereas the length of the rigid strap is not allowed to be any shorter than the maximum anticipated distance between the signal and ground probes, which can be one inch or more. This means that noisy components that are relatively far removed from the vicinity of the measurement and ground sites can still be near enough to the unused portion of the strap so that spurious energy leaks into the strap and impairs the accuracy of the readings which are being taken. This also means that if the vicinity surrounding the test and ground sites is cluttered with high-profile components, there is a strong possibility that the unused portion will interfere physically with these components to prevent positioning of the signal and ground probes on their respective sites.

Soar shows a fixed-length flexible ground strap permanently connected at each end to a respective probe. Because of its flexibility, the strap used in Soar arches outwardly when the signal and ground probes are brought together for close-in probing. Like the unused portion of the rigid strap, this arched portion can pick up noise from devices which are relatively far away and can interfere with surrounding components when attempts are made to move the probes to certain of their positions. Furthermore, if the signal and ground probes are inadvertently moved apart in the X-Y plane by a distance exceeding the length of the strap, this can result in a broken probe tip or can cause a hardened tip to be dragged across the device causing damage to the device surface. Moreover, the Soar return line does not permit the Z-axis or vertical position of each probe to be varied independently. If, for example, the signal probe is lifted over a high profile component and brought back down to a new measurement site, it is also necessary to lift and then reposition the ground probe.

Chiyojima shows a roll-out strap assembly where the roll-out mechanism includes a reel mounted rotatably about the signal probe and around which the flexible strap is wound. The assembly also includes a protective enclosure, which houses the reel and strap, and a take-up mechanism comprising a crank geared with the reel so that when the crank is turned, the strap is rewound about the reel for close-in probing.

Although, in Chiyojima, operation of the crank keeps the length of the strap to a minimum, if the operator accidentally applies too much force to the crank, this can drag the tip of a probe across the device or can cause the strap to break clear of its protective enclosure so the enclosure must be taken apart in order to make repairs. The same problems occur if the signal and ground probes are separated by a distance in the X-Y plane which exceeds the maximum length of the strap. Additionally, the overall assembly has many parts that require careful fitting, so that the interface is expensive to assemble and not readily adaptable to preexisting probe systems. Furthermore, because the strap is permanently connected at each of its ends to a respective probe, both probes must be repositioned whenever there is a vertical or Z-axis movement by one of the probes. Finally, the wound portion of the strap and its bulky enclosure obscures the view that looks directly down at the probes so that during close-in probing, it is often impossible to confirm the precise position of the tip of the signal probe.

Accordingly, an object of the present invention is to provide an improved return line system for high frequency probe stations.

A related object of the present invention is to provide a return line which has minimal sensitivity to noise that occurs outside the immediate probing vicinity yet which is cost-effective to produce.

Another related object of the present invention is to provide a return line in which a signal probe and ground probe are reliably connected electrically yet excessive X-Y plane separation between the probes will not result in damage to the probes or the device under test.

Still another related object of the present invention is to provide a return line which makes possible replacement of worn signal or ground probe tips without replacement of the entire probe head assembly including the X-Y-Z positioners.

Yet another related object of the present invention is to provide a return line that enables the signal probe tip to be lifted over a high-profile component and brought back down to a new measurement site without the need to also reposition the ground probe.

Yet another related object of the present invention is to provide a return line that enables close-in probing even when the surface of the device is cluttered with high-profile components.

Yet another related object of the present invention is to provide a return line which is readily adaptable to preexisting systems.

Yet another related object of the present invention is to provide a return line which accommodates quick travel by the signal probe between different measurement sites.

SUMMARY OF THE PRESENT INVENTION

To achieve the above objects, a first aspect of the present invention includes a return line assembly having a sheet-like conductive strap which electrically interconnects a first conductor of a first probe and a second conductor of a second probe. The strap includes a substantially flat central portion and further includes a mechanism for automatically reducing the length of the central portion when the separation between the first probe and the second probe is reduced. Because the length of the central portion is automatically adjusted when the probes are moved together for close-in probing, there is no longer any unused portion of the strap that extends a significant distance away from the probing vicinity where it can electrically interact with remote components or physically interfere with such components to prevent certain close-in probing positions. Nor is the travel of the probes closer together interrupted by the need to wait for operator adjustments to the return line.

A second aspect of the invention includes a return line having a sheet-like conductive strap where the strap includes a mechanism for automatically detaching the strap from one or the other of the probe when the separation between the probes exceeds a predetermined maximum probe distance. This ensures that overtravel between the probes will not result in damage to the probes or the device under test.

A third aspect of the invention involves a method for making a return line assembly which includes providing a sheet-like conductive strap having a first end and a self-coiling second end. The first end of the strap is electrically connected to a first conductor of a first probe and the second end is electrically connected to a second conductor of a second probe so as to establish an automatically detachable connection between the second end and the second conductor. For example, in accordance with one preferred technique, the second probe includes a sharpened tip which is inserted centrally within the second end while the second end is in its coiled position. This results in a return line connection which is not only safer if probe overtravel occurs but is also convenient, inexpensive to produce, and easy to adapt to preexisting probe systems.

A fourth aspect of the invention involves a return line assembly having a sheet-like conductive strap where the strap includes a substantially flat central portion and a self-coiling end portion. This aspect can desirably be combined with a spindle, where the spindle has a main body configured to engage a respective one of the probes and a post member projecting from the main body for receiving the self-coiling end portion of the strap in a coiled position about the post member. The spindle facilitates reattachment of the strap between the probes without repositioning of either probe. Additional features of the spindle, which are further described below, enable better tip visibility and more reliable electrical connection during close-in probing as well as a greater range of independent probe movement along the Z-axis.

A fifth aspect of the invention involves a process for making the sheet-like conductive strap which includes providing a substrate, forming a first interface by depositing a first layer of a first material on the substrate using a thin film process, forming a second interface by depositing a second layer of a second material on the first material, and overcoming the forces of adhesion acting along the first interface so that the first and second materials are removed from the substrate with the second interface intact. This process facilitates the manufacture of straps which have particularly well-defined and uniform physical characteristics.

Figures 7, 9:
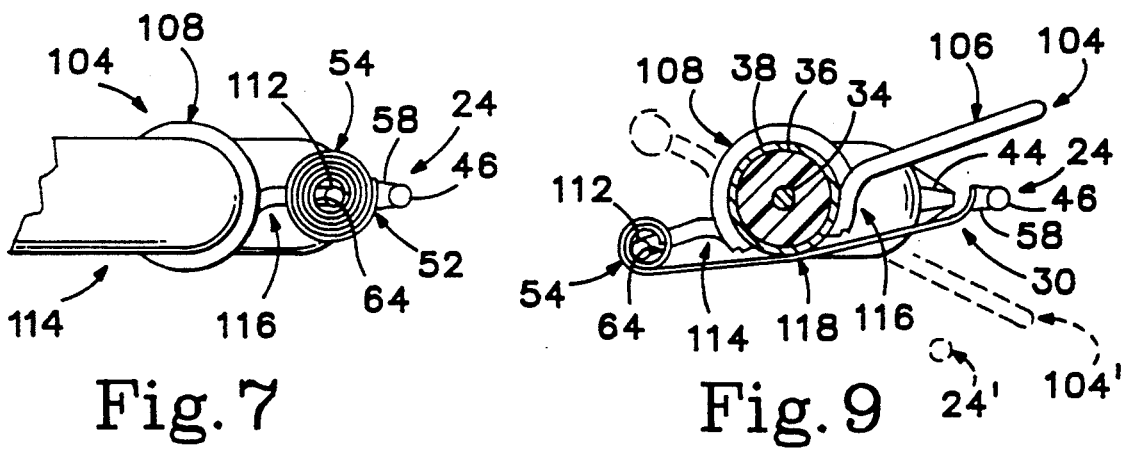
FIG. 7 is a plan view taken along lines 7—7 in FIG. 6 after connection of the ground probe.

FIG. is primarily a plan view taken along lines 9—9 in FIG. 7 where the spindle and ground probes are shown in cut-away and sectional view, respectively, to reveal a connection detail and where alternative positions of these same components are indicated in dashed lines.

FIGS. 10(a)—10(e) show a preferred process, in accordance with the present invention, for making the sheet-like conductive strap.

FIG. is 10(a) is a transverse sectional view showing the upper portion of a substrate after it has been preheated and after metallic layers have been sputter deposited on upper portion in accordance with the preferred process.

Figure 10A:
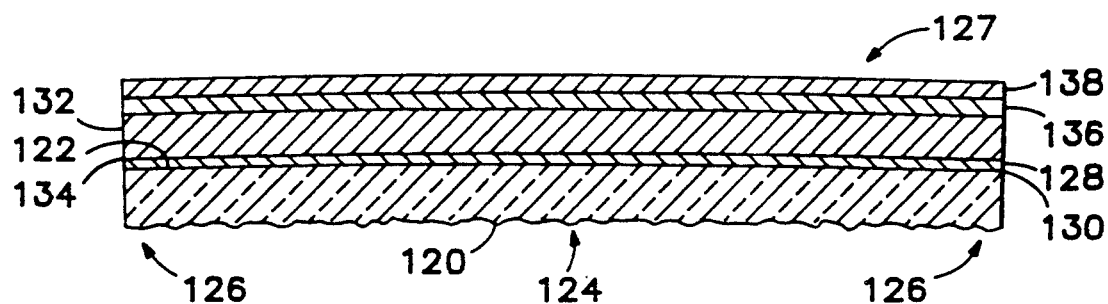
Figure 10B:
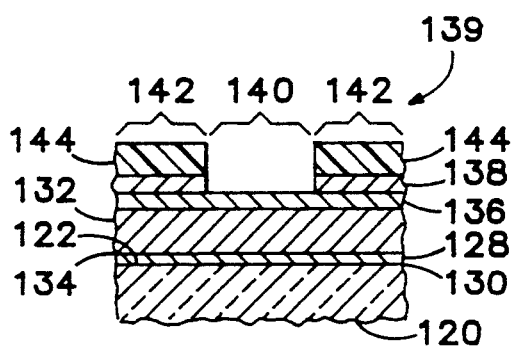

FIG. 10(b) shows in sectional view a fragment of the intermediate composite shown in FIG. 10(a) where the fragment has been selected to show how an individual strap is made and where additional photodefining and etching procedures have been carried out in accordance with the preferred process.

Figure 10C:
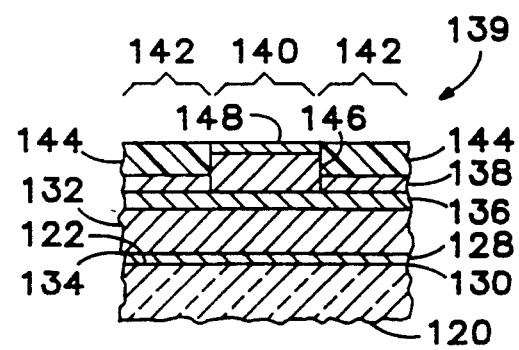

FIG. 10(c) is similar to FIG. 10(b) except showing a subsequent plating procedure in accordance with the preferred process.

Figure 10D:
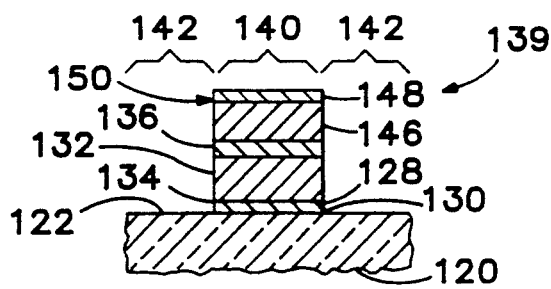
Figure 10E:
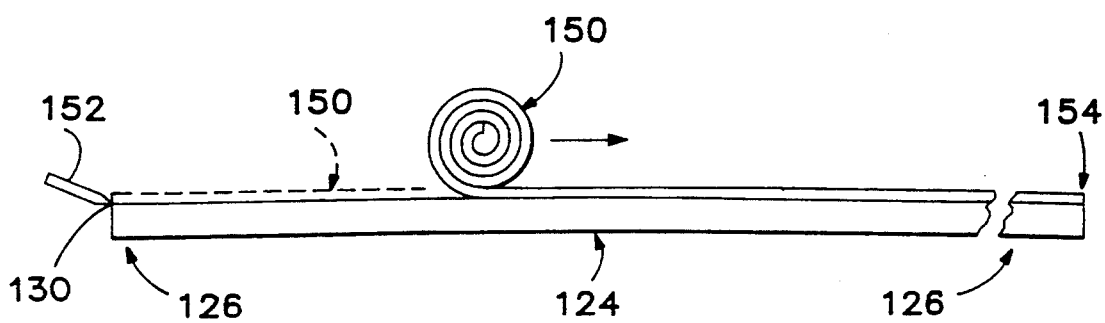

FIG. 10(d) is similar to FIG. 10(e) except showing a subsequent etchback procedure used to form the strap in accordance with the preferred method.

FIG. 10(e) is a side elevational view illustrating a preferred technique for removing the strap from the substrate, where the position of self-coiling strap is shown just before and just after the start of removal in dashed-line and solid-line view, respectively.

DESCRIPTION OF THE PREFERRED EMBODIMENTS

Figure 4:
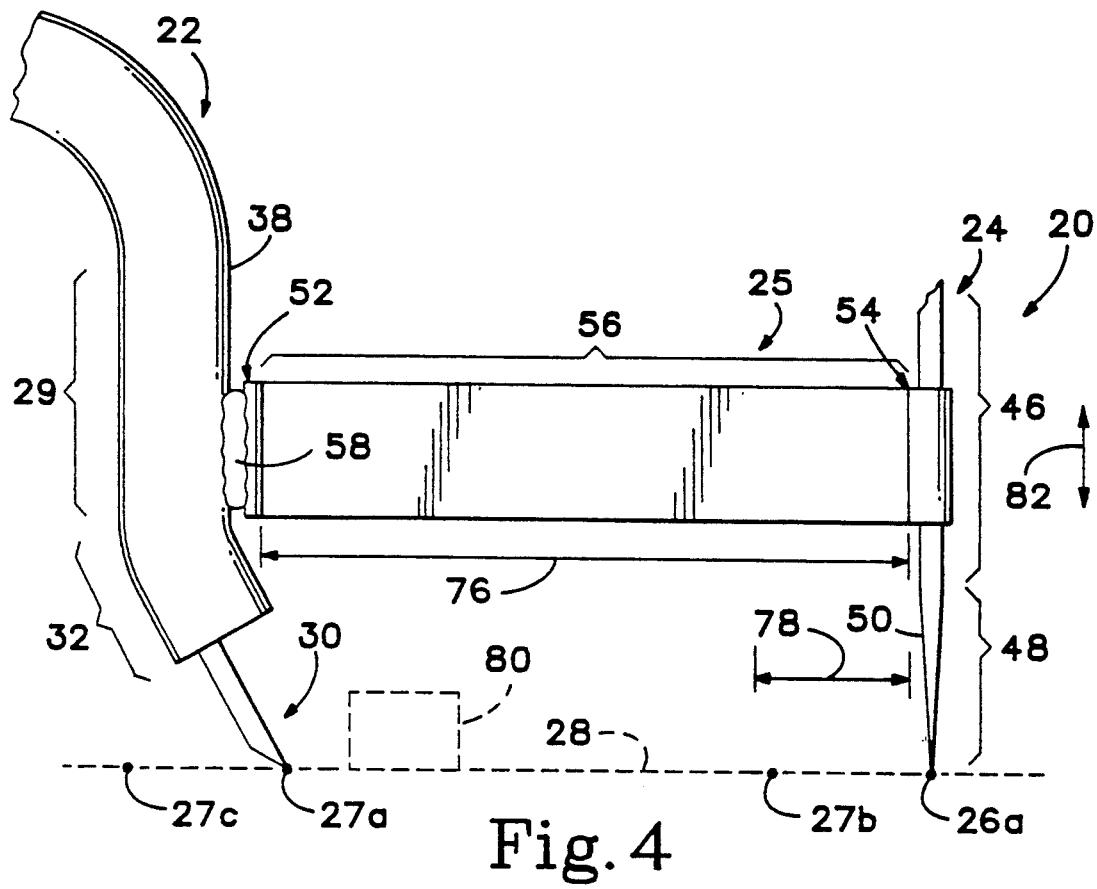
FIG. 4 is similar to FIG. 1 but shows the return line assembly after repositioning of the probes has occurred and further illustrates, in dashed-line view, a high-profile component rising above the measurement plane.

FIG. 4 shows a preferred embodiment of a return line assembly 20 constructed in accordance with the present invention. The assembly includes a signal probe 22 which is electrically connected to a ground probe 24 by a sheet-like conductive strap 25. The strap and the ground probe provide a convenient return path for the signal probe so that the signal probe can be returned, for example, to a respective ground site 26a which is set off from the particular measurement site 27a that the signal probe is measuring. The ground site 26a and measurement site 27a may be pads or traces that are bonded, for example, to the top surface or measurement plane 28 of a board or wafer, as represented in the drawings by a dashed line. The signal and ground probes are mounted from above, each preferably on an X-Y-Z positioner (not shown) of a conventional high-frequency probe station in order to permit multidirectional movement of each probe to other sites.

The strap 25 includes a self-coiling capability that enhances the electrical and physical operation of the assembly. The strap and the operational benefits which its use confers are described following a description of the other components in the return line assembly. A second embodiment of the return line assembly is then described followed, finally, by a detailed description of a preferred process for making the strap.

Figure 3A:
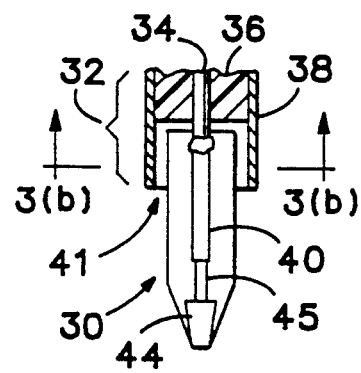
FIG. 3(a) is a view partially in section taken along lines 3(a)—3(a) in FIG. 1 revealing details of the tip construction of probe.
Figure 3B:
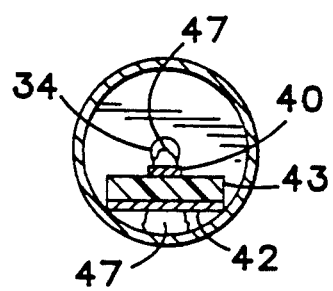
FIG. 3(b) is a sectional view taken along lines 3(b)—3(b) in FIG. 3(a) revealing further details of the tip construction.

The signal probe 22 includes an elongate cylindrical portion 29, a tip portion 30, and a bent end portion 32 that is formed in the signal probe in order to make the tip portion more visible to an observer looking down on the probe. The cylindrical portion and bent end portion are formed by semi-rigid cable which is nominally of 0.047 inch outer diameter. Referring also to FIGS. 3(a) and 3(b), the semi-rigid cable is of conventional construction and includes a center conductor 34, inner dielectric 36 and a somewhat stiff but still bendable outer conductive cladding 38.

Viewing FIGS. 3(a) and 3(b) together, the tip portion 30 of the signal probe 22 comprises a microstrip transmission line in which a signal line conductor 40 and a ground line conductor 42 are bonded to the surface of an alumina or other dielectric substrate 43, preferably by a high-definition photolithographic process. The signal and ground line conductors are preferably formed of a high conductivity metal, such as gold. At the end where they come into contact with the device surface, preferably each line conductor 40 and 42 is plated with a hard metal 44, such as nickel, in order to prevent undue wear. In order to increase the output impedance of the probe, a resistive layer 45 is also formed on the substrate in-line with the signal line conductor so that the measurement site is not unduly loaded by the probe. Alternatively, an in-line active network can be mounted on the substrate 43 to increase the tip output impedance.

As shown in FIG. 3(a), a portion of the inner dielectric 36 of the semirigid coaxial cable is removed from the bent end portion 32 to create a well 41. The well 41 is preferably formed by preheating the semirigid coaxial cable to 240° C. for one minute so that the Teflon TM dielectric 36 extrudes out the end of the cable, after which the cable is allowed to cool and the extruded dielectric trimmed off. Physical pressure on the expanded dielectric at the end then suffices to form the well. The substrate 43 is then inserted inside the well and the signal and ground line conductors 40 and 42 connected, as shown in FIG. 3(b), to the center conductor 34 and conductive cladding 38 respectively, such as by reflow solder 47. This construction provides the signal probe 22 with a controlled impedance along its entire extent despite transformation from a coaxial structure to a microstrip structure.

The ground probe 24, like the signal probe 22, also has an elongate cylindrical portion 46 and further includes a sharpened needle-like tip 48. The ground probe is conventionally formed of a hard conductive metal, and the outer surface 50 of the probe preferably includes a thin plated layer of highly conductive material such as gold.

Referring to FIG. 4, the sheet-like conductive strap 25 includes a first end portion 52 and a self-coiling second end portion 54. Except when the second end portion is in its initial or fully-coiled position 55 (FIG. 1), the strap further includes an extended or substantially flat central portion 56 located between the first and second end portions. In the first preferred embodiment 20 of the assembly shown in FIGS. 1-5, the first end portion 52 of the strap is electrically connected to the conductive cladding 38 of the signal probe by a permanent bonding agent, such as silver epoxy 58, so that an unbreakable or infrangible connection is established between the first end portion and the signal probe 22. On the other hand, an automatically detachable connection is formed between the self-coiling second end portion 54 of the strap and the ground probe 24.

Figure 1:
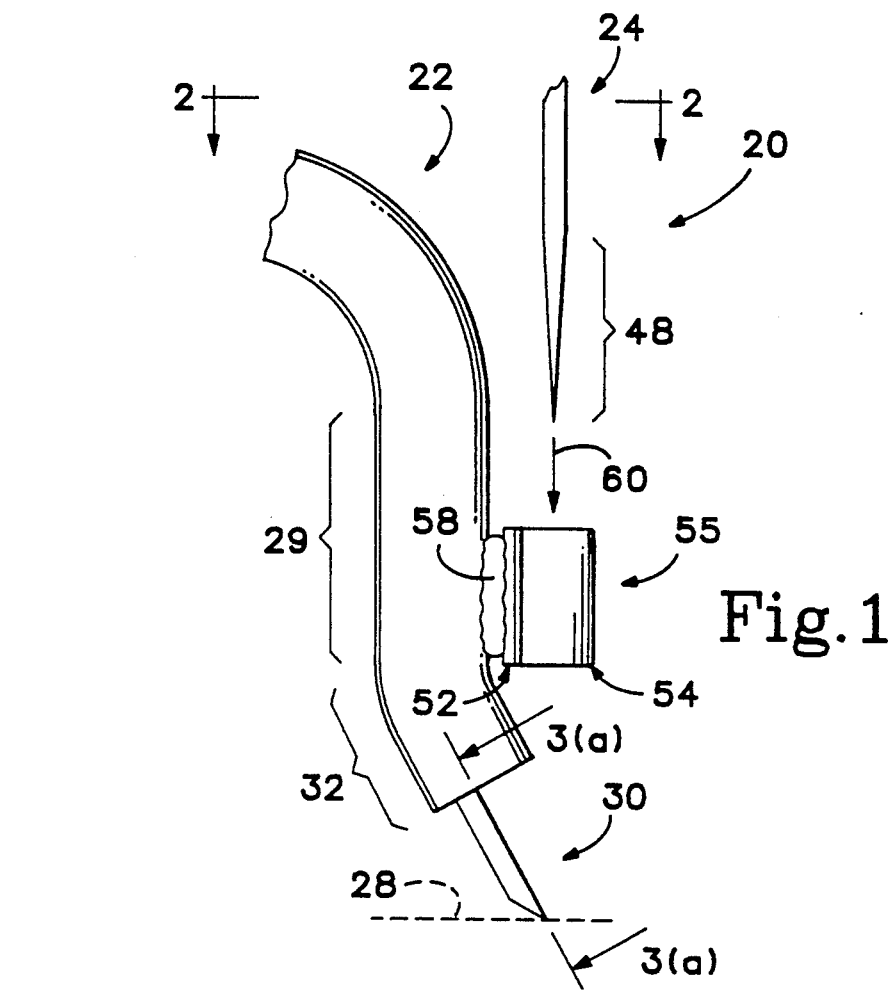
FIG. 1 is a side elevational view showing a preferred embodiment of the return line assembly, in accordance with the present invention, before connection of the ground prob the assembly.

Referring to FIG. 1, the automatically detachable connection is preferably made by moving the ground probe 24 toward the strap 25 in the direction-of-attachment 60 that is shown while the second end portion 54 of the strap is in its initial or fully-coiled position 55 so that the sharpened tip 48 of the probe is inserted centrally within the second end portion of the strap. This procedure enables electrical connection to be made by probe movement alone.

Figure 2:
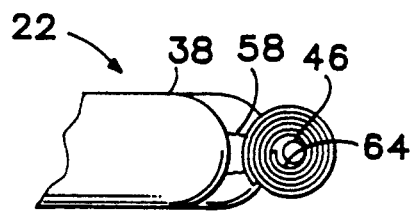
FIG. 2 is a plan view looking along lines 2—2 in FIG. 1 after connection of the ground probe in the assembly.

FIG. 2 shows how the cylindrical portion 46 of the ground probe rides connectably against the inside coil or turn 64 of the self-coiling second end portion after the tip 48 of the ground probe has been lowered to the same measurement plane 28 as the tip 30 of the signal probe. As shown in FIG. 4, if the ground probe and signal probe are now moved away from each other in order to probe a particular ground site 26a and measurement site 27a, respectively, the self-coiling second end portion is now moved to an extended position, that is, to a position in which the strap includes the substantially flat central portion 56. In this operative position, the ground line conductor 42 (FIG. 3) of the signal probe is returned or tied to the reference potential of the ground site 26a via the continuous electrical path through the ground probe 24, the strap 25, the silver epoxy 58, and the conductive cladding 38.

From the foregoing description, it will be recognized that the preferred embodiment 20 of the return line assembly that is shown in FIGS. 1-5 has few parts and that these are easily assembled and is, moreover, readily adaptable to preexisting probe setups since the self-coiling strap 25 can be used without special modification being made to the probes of these other setups. At the same time, the assembly performs well electrically in the sense of having minimal sensitivity to noise.

For example, with reference to FIG. 4, if the separation between the signal probe 22 and the ground probe 24 is reduced in order to bring the tip 30 of the signal probe to a new second measurement site 27b which is closer to the ground site 26a, the original length 76 of the flat central portion 56 of the strap is automatically reduced to a new second length 78 which is about equal to the spacing between the second measurement site and the ground site. Accordingly, if a noisy component 80 is mounted on the device but is located in a position that is neither near nor between the second measurement site and the ground site, the reduced second length of the central portion affords little opportunity for the noise emitted by this component to electromagnetically couple into the strap. If, on the other hand, the flat central portion 56 were to retain its original length 76, despite movement of the probes closer together, the resulting proximity of this central portion to the noisy component would significantly increase the risk of electromagnetic interaction occurring between the component and the strap. Because the majority of probe measurements are made close-in, with the probe tips near each other, in most cases the length-adjusting feature of the strap limits the noise on the strap to acceptably small levels even in very noisy environments.

Because the length 76 of the strap 25 is reduced or increased automatically in accordance with the direction of relative movement between the probes, repositioning of the probes between each individual measurement can be accomplished quickly. This, in turn, shortens the period of time that is needed to test a particular device. For example, referring to FIG. 4, regardless of how far the tip 30 of the signal probe 22 needs to travel in order to move from the first measurement site 27a to the second measurement site 27b, by the time this tip reaches the second measurement site, the original length 76 of the central portion of the strap will have already been reduced correspondingly. This proportional tracking feature is not available, by comparison, in a manual rewind type of interface where larger shifts in probe position translate into more time needed to rewind the excess portion of the strap.

The component 80, which is represented in dashed lines in FIG. 4, also has a relatively high profile that extends well above the measurement plane 28 of the device. If, for some reason, the tip 30 of the signal probe cannot be moved around the sides of this component in order to reach the second measurement site 27b because, for example, other components are in the way, it is then necessary to use a vertical movement of the signal probe to lift the probe over the component. The preferred embodiment 20 allows this vertical movement to occur without also requiring that the ground probe 24 be lifted because the self-coiling second end portion 54 of the strap is slidably movable in the vertical or Z-axis direction 82 across the elongate cylindrical portion 46 of the ground probe while maintaining its connection to the ground probe. Accordingly, there is no need to spend additional time repositioning the tip of the ground probe each time the signal probe is vertically repositioned.

Figure 5:
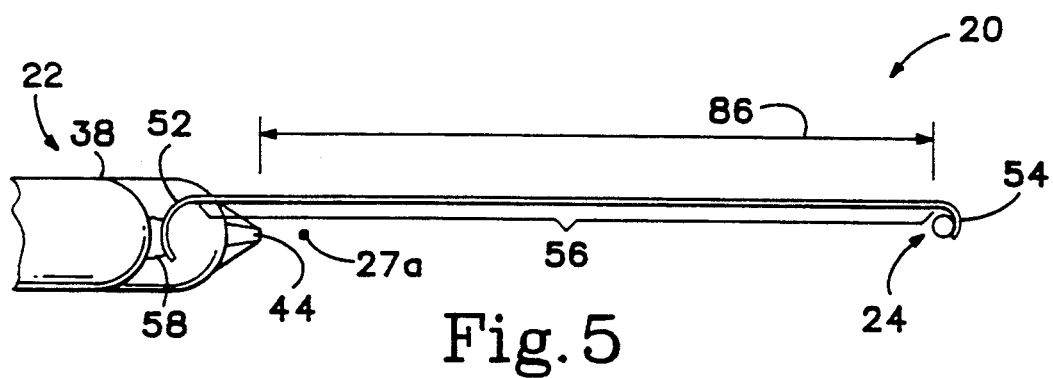
FIG. 5 is a plan view showing the return line assembly of FIG. 4 as seen by an observer looking down on the assembly after the signal probe has been shifted to the left.

Referring to FIGS. 4 and 5 together, if the station operator attempts to move the signal probe 22 to a third measurement site 27c so that the spacing between the signal and ground probes 22 and 24 now exceeds a predetermined maximum probe distance 86, which is indicated in FIG. 5, the self-coiling second end portion 54 of the strap will automatically detach from the ground probe and resume its initial or fully-coiled position 55 as shown in FIG. 1. This prevents breakage of the ground probe or, alternatively, prevents the sharpened tip 48 of the ground probe from being dragged by the strap across the surface of the device, which action could otherwise scratch or damage the particular surface elements on the device.

Referring to FIGS. 6-9, a second preferred embodiment 100 of the return line assembly is shown. As between FIGS. 6-9 and FIGS. 1-5, like reference numerals have been used to refer to like elements. In this second preferred embodiment 100, the first end portion 52 of the strap is now connected by silver epoxy 58 to the ground probe 24, rather than to the outer cladding 38 of the signal probe, and the self-coiling second end portion 54 of the strap is now received on a U-shaped post member 102 which is part of a spindle 104 that now engages the signal probe.

The spindle 104 has three distinct portions including a handle portion 106, a main body portion 108, and the U-shaped post member 102. The main body is configured as a series of spirally-wound coils which have an inner diameter suitably dimensioned for frictionally engaging the elongate cylindrical portion 29 of the signal probe. The U-shaped post member 102 is attached to the main body so that when the main body is engaged to the signal probe, an inside leg 110 on the post member downwardly extends from the main body toward the probe tip 30, and an opposite outside leg 112 on the post member upwardly extends away from the probe tip back toward the main body. In other words, the post member extends primarily off to one end of the main body as depicted. The outside leg 112 of the post member is pin-like in shape in order to facilitate ready insertion of this leg centrally within the respective coils of the second end 54 of the strap when the ground probe 24 is moved along the direction-of-attachment 60. Preferably, the different portions of the spindle 104 are formed by the respective sections of a single piece of stiff conductive wire.

It will be recognized from the above description that many of the advantages associated with the first preferred embodiment 20 of the return line are likewise achieved with the second embodiment 100. For example, as with the first embodiment, the self-coiling capability of the strap 25 in the second embodiment minimizes strap length and spurious noise pick-up, enables automatic detachment of the strap when overtravel between the probes occurs, and permits quick probe repositioning between measurements.

Figures 6, 8:
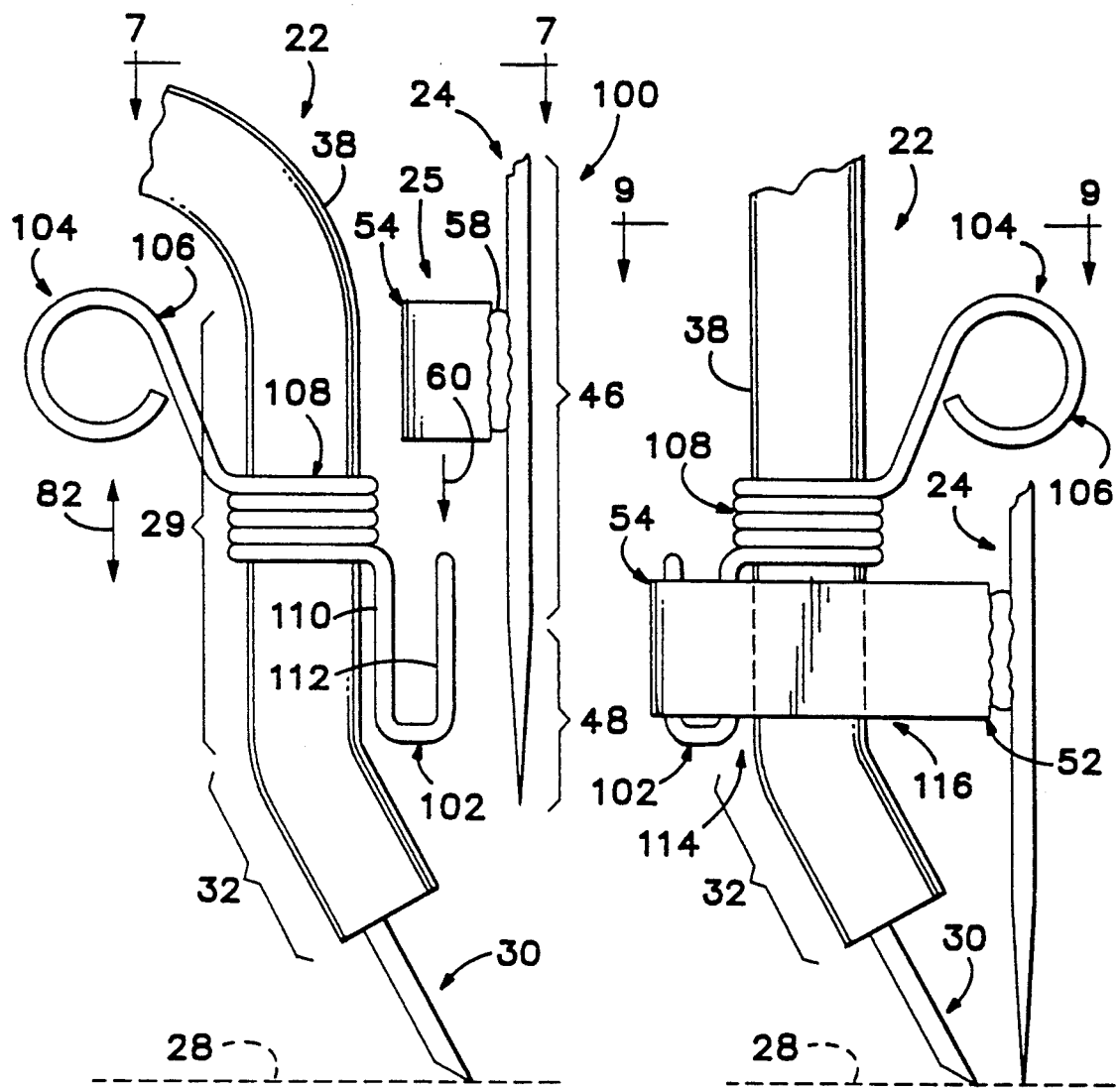
FIG. 6 is a side elevational view of a second preferred embodiment of the return line assembly before connection of the ground probe in the assembly.
FIG. 8 is similar to FIG. 6 but shows the assembly after connection of the ground probe and after rotation of a spindle that pulls the strap of the invention against probe.

With regard to the capability for independent vertical probe movement, this feature is further enhanced in the second embodiment due to the spindle 104. In particular, referring to FIG. 6, the main body 108 of the spindle only engages the elongate cylindrical portion 29 of the signal probe frictionally, so that it is possible to vary the position of the post member 102 along the vertical axis 82 in a direction either toward or away from the measurement plane 28. Regardless, then, of which probe, signal or ground, is being moved independently vertically, it is possible to keep the strap 25 attached once it is initially connected by making corresponding shifts in the vertical position of the post member. With the first embodiment 20, however, as seen most clearly in FIG. 4, if vertical repositioning of the ground probe 24 (as opposed to the signal probe 22) is attempted, there is a possibility that the self-coiling second end portion 54 of the strap will slip off the lifted tip of the ground probe. Referring to FIG. 6, the possibility of strap slip-off is further reduced in the second embodiment 100 by the extension of the pin-like outside leg 112 of the post member away from the tip 30 of the signal probe.

The spindle 104 is also useful for improving tip visibility during close-in probing. Comparing FIGS. 6 and 8, the frictional engagement between the main body 108 of the spindle and the outer cladding 38 of the signal probe 22 allows the spindle to be rotated by its handle portion 106 about the signal probe. During such rotation, the self-coiling second end portion 54 of the strap is carried toward a far side 114 of the signal probe which is located opposite to that side 116 which faces the ground probe. FIGS. 7 and 9, which correspond to FIGS. 6 and 8, show the alternate views that result as seen by an observer who is looking down at the probes before and after, respectively, the spindle has been rotated. Typically a low-magnification lens (not shown) is used by the observer to view the setup to ensure that each probe tip is accurately positioned. The movement of the self-coiling second end portion 54 to the far side 114 of the signal probe affords the observer a better view (FIG. 9) of the signal probe tip 30 than that view (FIG. 7) which is obtained when the self-coiling second end portion is to the near side 116 of the signal probe, particularly, as shown, during close-in probing where the numerous coils of the second end can completely hide the signal probe tip from view.

The spindle 104 not only improves tip visibility during close-in probing but also increases, during such probing, the reliability of the electrical interconnection made. Referring to FIG. 7, it will be recognized that the outer diameter of the pin-like outside leg 112 of the post member is somewhat smaller than the inside diameter of the inside coil or turn 64 of the second end portion of the strap. While this facilitates initial insertion of the outside leg 112 within the coils of the second end, it also makes it possible for the outside leg to be placed in a position during close-in probing where it does not actually contact the inside turn 64 of the strap.

To overcome this problem, the spindle 104 of the second embodiment 100 is rotated during close-in probing to the position shown in solid-view in FIGS. 8 and 9. This not only causes the self-coiling second end portion 54 of the strap to be shifted to the far side 114 of the probe, thereby improving visibility, but also causes the central portion 56 of the strap to draw across and bear against the conductive cladding 38 of the probe, thereby establishing a reliable electrical connection 118 with the signal probe. Because the U-shaped post member 102 is off to one end of the main body 108 of the spindle, this connection occurs, as shown in FIG. 8, clear of the main body. As indicated in FIG. 9, the self-coiling characteristic of the second end portion 54 keeps the flat central portion 56 of the strap in moderate traction, thereby increasing the connection force.

As shown in dashed-line view in FIG. 9, even when the position of the ground probe 24' is no longer in-line with the tip 30 of the signal probe, it is still possible to move the spindle 104' to a position that will enhance the reliability of the electrical connection made. That is, reliable electrical connection during close-in probing is an advantage offered by the spindle regardless of the angular orientation between the signal probe and the ground probe.

The first preferred embodiment 20 of the return line assembly, which is shown in FIGS. 1-5, and the second preferred embodiment 100 of the assembly, which is shown in FIGS. 6-9, both use a sheet-like conductive strap 26 having a self-coiling second end portion 54. A preferred process for making the sheet-like strap, which takes advantage of thin film technology, is shown in FIGS. 10(a)-10(e).

Referring to FIG. 10(a), the first step in the preferred process is providing a substrate 120 that has an ultrasmooth surface 122 and a relatively low coefficient of thermal expansion (e.g., averaging less than $50 \times 10^{-7}/°$ C. over a temperature range of 0° C. to 550° C.). The term "ultrasmooth" is used herein to indicate that the peak-to-valley roughness variations in the surface are a small fraction of the thickness of the thin film layers that are subsequently applied to the surface. A suitable material for the substrate is 20 mil thick barium borosilicate glass that has been drawn into sheets of finished thickness and that obtains its smooth final finish directly from the molten glass. A commercially available glass of this type is made by Corning Glass Works based in Corning, New York and sold under the manufacturer's designation "Sheet Glass 7059."

The glass substrate is preheated on a pallet for a minimum of one hour at 100° C. after which it is immediately introduced into the sputtering processing system (not shown) where deposition of succeeding layers occurs. Inside the sputtering processing system, additional heat is applied to the glass substrate under a chamber vacuum of below $10^{-7}$ torr in order to raise the temperature of the substrate to about 500° C. Referring to FIG. 10(a), as well as to FIG. 10(e) showing a later step in the process, this causes the glass substrate to develop a bowed curvature so that the middle portion 124 of the substrate bulges slightly in a convex direction outwardly away from the end portions 126 of the substrate. Following this heat treatment, several layers of alternately different metallic material are deposited on the substrate by sputtering in order to achieve the multilayered intermediate composite 127 depicted in FIG. 10(a).

As is well known to those of ordinary skill in semiconductor fabrication technology, sputtering is a process in which a metal target is bombarded with positive ions so that individual atoms of metal are ejected from the target for redeposit on the substrate or other surface desired. This process, accordingly, can be used to deposit so-called "monolayers" so that metal layers of small but very well-controlled thickness can be made. Taking advantage of this capability, the first layer 128 which is deposited on the substrate is gold (Au) having a thickness within the range of 34Å to 48Å and preferably of about 42Å. The purpose served by the use of such a thin layer is further clarified below.

Due to the relative molecular nature of Au and glass, the intermolecular forces of adhesion which act along the first interface 130 between the Au layer 128 and the substrate 120 are relatively poor when compared to the normal values that are traditionally sought when creating a thin film bond. In thin film technology, the traditional object has been to create strong bonds so that the resulting composite will maintain its permanency even when environmental conditions become severe. Far from bonding strongly to its underlying substrate, however, the Au layer 128 adheres only poorly to the glass substrate. This is attributable, on a molecular level, to Au being inert to the oxides in glass.

A second metallic layer 132 of titanium tungsten (TiW) is next deposited, by sputtering, on the first layer 128 so as to form a second interface 134. This alloy is nominally 3% to 20% titanium by weight (preferably 5%), where the remainder is tungsten, and is deposited so that the thickness of the second layer is within the range of 1.0 to 2.5 microns. Within this range, the particular thickness chosen can vary so as to meet the needs of a particular application. For example, to obtain a strap having a large self-coiling bias and a small-diameter inner coil for use with hardened but thin probe tip, a thickness near the upper end of the range is chosen.

Due to the molecular character of the TiW alloy, the intermolecular forces of adhesion that act along the second interface 134 are relatively large, much larger, for example, than those which act along the first interface 130. This is consistent with the objective of creating a strong permanent bond between the first and second layers. At the same time, due to the respective molecular structures of TiW and glass, as well as the extreme thinness of the first layer 128, intermolecular forces of adhesion also act between the second layer 132 and the substrate 120. That is, they act across the first layer 128. These interlayer forces are attributable, on a molecular level, to the strong metallic bond between the TiW and the gold and the strong chemical bond between the TiW and the oxygen in the glass.

In addition to these interlayer forces, strong compressive forces act internally in the TiW layer 132. These compressive forces are due, in part, to the sputtering process, which achieves a very fine-grained and uniform structure throughout the TiW layer 132. They are also due, in part, to the thickness of the TiW layer, where the thicker the layer the larger the cumulative stresses. They are further due, in part, to the degree of substrate curvature which is increased by preheating the glass substrate 120.

The last layers which are deposited by the sputtering process are a third layer 136 composed of Au having a nominal thickness of 800Å and a fourth layer 138 of TiW which has a composition chemically equivalent to that of the second layer 132 and which has a nominal thickness of 400Å. After these layers are deposited, the intermediate composite 127 is removed from the sputtering equipment for further processing. The cooling occurring in the substrate after its removal from the heated sputtering chamber further effects the internal compressive forces which act in the deposited metallic layers due to the uneven shrinkage of the substrate and the layers caused by their different coefficients of thermal expansion.

FIGS. 10(b)-10(d) show, in section, a fragment 139 of the intermediate composite 127 shown in FIG. 10(a) where, for clarity of illustration, the fragment has been selected in order to show additional steps of the preferred process as they relate to forming a single strap. The larger piece shown in FIG. 10 will, of course, allow the bulk processing of a number of straps at once, but the process, as it pertains to each strap, is the same. It is further noted here that the dimensional relationships, where they are critical, are specified in the text, and it can in no way be assumed in FIGS. 10(a)-10(e) that each element has been drawn to its correct relative scale.

Referring to FIG. 10(b), the area in which the strap is formed is indicated by reference numeral 140, while the outlying areas are indicated by reference numeral 142. As indicated in the figure, a conventional photoresist layer 144 is deposited, preferably by a photolithographic process, on the fourth layer 138 in order to mask the outlying areas 142. Next, the TiW layer 138 is etched away from the selected area 140 using a conventional etching agent such as hydrogen peroxide.

After the initial etching step above, desirably a plating step is performed. Referring to FIG. 10(c), that portion of the Au third layer 136 which is left exposed in the selected area 140 after the etching step is now plated with a fifth layer 146 that is composed of nickel having a thickness within the range of 1.0 to 2.5 microns. Next, the nickel layer is plated with a sixth layer 138 composed of Au and having a thickness within the range of 0.7 to 1.0 microns.

Referring to FIG. 10(d), the next step in the preferred process of making the strap is to etch away all the material above the substrate 120 which lies outside of the selected area 140. For example, referring also to 5 FIG. 10(c), the photoresist layer 144 can be removed with acetone, the outside portions of the first and third layers 128 and 136 of Au can be etched away with potassium iodide, and the outside portions of the second TiW layer 132 can be etched away with hydrogen peroxide. The final composite which is left defines a completely formed strap 150.

Referring to FIG. 10(e), the final processing step is to dislodge each completely formed strap 150 from the substrate 120 on which it was made. Desirably this is done before a considerable time has elapsed in order to prevent undue stress relief from occurring in the metallic layers which have been formed. In FIG. 10(e), the position of the completed strap just before dislodgment is indicated in dashed-line view while a position of the completed strap just after dislodgment is indicated in solid-line view.

To begin strap removal, a sharpened edge 152, such as that of a razor blade, is inserted between the first layer 128 (FIG. 10(d)) and the substrate 120 so as to mechanically introduce a position of discontinuity in the first interface 130. If the foregoing steps of the process have each been properly carried out, this has the effect of initiating a self-continuing mechanical reaction or cycle in which the self-coiling bias of the completely formed strap pulls the strap away from the position of discontinuity and thereby produces a second position of discontinuity immediately adjacent to and replacing the first. This reaction sequence successively repeats itself until the position of discontinuity reaches the extreme end 154 of the strap, whereupon the strap is fully released. In effect, after a small amount of initial assistance, the titanium second layer 132, by means of the strong compressive forces acting in that layer, strips itself and each of the other remaining layers from the substrate, while each of these layers (including the first layer) and all but the first interface are kept intact.

If the layers of the strap are to be chosen from different materials and in different thicknesses than those which have now been specified for the preferred process, certain underlying requirements can be used to formulate guidelines for making these choices. Referring to FIG. 10(d), the first of these relate to the thickness of the first layer 128. On the one hand, it is desirable to keep this thickness to a minimum so that the various layers will maintain their position on the substrate 120 during processing until the completely formed strap 150 is ready to be removed. Minimizing the thickness of the first layer 128 increasingly permits the potentially large forces of adhesion which act between the second layer 132 and the substrate 120 to supplement the relatively weak forces of adhesion which act between the first layer 128 and the substrate. On the other hand, it is important that the thickness of the first layer not be made too thin or else the self-coiling bias of the strap will not be sufficient to pull the strap away from the substrate. The appropriate thickness for the first layer depends on a satisfactory resolution of these competing requirements for the particular choice of material made.

Referring to FIG. 10(d), another set of guidelines can be formulated for choosing the thickness of the second layer 132. This thickness, the type of metal used for the layer, and the degree of curvature induced in the surfaces of the substrate 120 by preheating, will cooperatively determine the strength of the compressive forces that act internally in the second layer. For example, if TiW is used in accordance with the preferred process, then the thicker the layer, the greater will be these compressive forces. More generally, when choosing the thickness appropriate for another type of material, the following competing objectives should be kept in mind. On the one hand, the compressive forces which result should not be so high that they cause the completed strap to wrap so tightly on itself that it cannot be penetrated by a probe. On the other hand, these compressive forces should not be so low that they cannot overcome the forces of adhesion which act along the first interface 130. The appropriate thickness for the second layer depends on a satisfactory resolution of these competing requirements for the particular choice of second layer material made.

Referring to FIGS. 10(d) and 10(e) together, when the sharpened edge 152 is inserted so as to introduce a position of discontinuity in the first interface 130, the forces of adhesion acting between the second layer 132 and the substrate 120 are weakened at that position, and the line-of-action of the compressive forces that act in the second layer 132 now have a component that pulls the first layer 128, second layer 132, and succeeding layers away from the substrate. In other words, after the initial discontinuity, these compressive forces overcome the forces of adhesion that normally hold the first interface 130 and substrate 120 together. This is repeated sequentially so that the next succeeding position of the interface is dislocated before dislocation occurs to any other remaining position of the interface. From this, the close relationship between the compressive forces and the self-coiling bias of the strap will be recognized. The significance of the sputtering process in achieving a uniform distribution of compressive forces will also be recognized, for without this uniformity, there could be certain positions along the interface where the compressive forces would be too weak for self-release to occur.

Referring to FIG. 10(d), another guideline relates to the choice of the substrate 120. If the surface of the substrate is not sufficiently smooth, not only will there be grain displacements and stress disparities in the layers deposited on the substrate, but there will also be interference with the self-releasing behavior described above. In particular, if the substrate surfaces are excessively rough, peaks on the substrate surface will protrude into the first layer 128 (FIG. 10(d)) thereby pinning the first layer to the substrate. Accordingly, a substrate of minimal surface roughness should be chosen.

Other combinations of materials other than those which have been described can be used for the various layers. For example, instead of a TiW second layer 132, an Au first layer 128, and a glass substrate 120, it is possible to use many other types of metals (e.g., chromium, vanadium, and tungsten) in the second layer, carbon in the first layer, and alumina in the substrate. Just as Au does not bond well to an oxide such as glass, so too does carbon not bond well to an oxide such as alumina. Similarly, the strong metallic bond between the TiW and the gold and the strong chemical bond between the TiW and the oxygen in the glass have their counterpart in the strong metal/carbon bond and the strong metal/oxide bond. However, it is difficult to use the thickness of the carbon layer for controlling the strength of the metal/oxide bond.

Although two preferred embodiments of the return line assembly have now been described, as well as a preferred method of making and connecting the self-coiling strap which is a component of both embodiments, it will be recognized that alternative assemblies and processes are possible without departing from the broader principles of the present invention. For example, in the first preferred embodiment of the return line assembly, it is possible to connect the first end of the strap directly to the ground line conductor on the signal probe tip rather than to the probe's outer cladding. In the second embodiment of the return line assembly, the spindle can be configured for mounting on the ground probe instead of the signal probe. With regard to the method of fabricating the self-coiling strap, by using a physical mask during sputter deposition, it is possible to eliminate the photolithographic and etching steps.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A return line assembly for a high frequency probe device comprising:
   (a) a first probe having a first electrical conductor;
   (b) a second probe having a second electrical conductor; and
   (c) a flexible sheet-like conductive strap electrically interconnecting said first electrical conductor and said second electrical conductor, wherein said strap automatically detaches detach from at least one of said first and second conductors when the separation between said first and second probes exceeds a predetermined maximum length of extension of said strap.

2. The assembly of claim 1 wherein said strap includes a self-coiling end portion adapted to automatically detach from said at least one of said first and second conductors.

3. A return line assembly for a high frequency probe device comprising:

(a) a first probe having a first electrical conductor;
(b) a second probe having a second electrical conductor; and
(c) a sheet-like conductive strap electrically interconnecting said first electrical conductor and said second electrical conductor, said strap integrally including a sheet-like end portion, said end portion being inherently self-coiling.

4. A return line assembly for a high frequency probe device comprising:
(a) a first probe having a first conductor;
(b) a second probe having a second conductor;
(c) a sheet-like conductive strap electrically interconnecting said first conductor and said second conductor, said strap including a substantially flat central portion and a self-coiling end portion; and
(d) a spindle having a main body configured to engage said first probe and post means projecting from said main body for receiving said self-coiling end portion in a coiled position about said post means.

5. The assembly of claim 4 wherein said first probe includes an elongate cylindrical portion and said main body is configured to adjustably engage said cylindrical portion to enable the position of said post means to be varied in a direction lengthwise of said cylindrical portion.

6. The assembly of claim 4 wherein said first probe includes a cylindrical portion and said main body is configured as a series of spirally-wound coils frictionally engageable about said cylindrical portion.

7. The assembly of claim 4 wherein said first probe has a tip and said post means includes a pin-like leg upwardly extending in a direction generally away from said tip when said main body operatively engages said first probe.

8. The assembly of claim 4 wherein said first probe includes a cylindrical portion and said main body is configured to rotatably engage said cylindrical portion to enable said self-coiling portion to be carried on said post means toward a far side of said first probe located opposite to that side of said first probe facing said second probe.

9. The assembly of claim 8 wherein said cylindrical portion has a conductive surface and said post means is configured so that when said self-coiling portion is carried on said post means toward said far side, said central portion of said strap is drawn across and bears against said conductive surface to establish a reliable electrical connection clear of said main body.

10. The assembly of claim 4 wherein said first probe has a tip and said post means includes a U-shaped member attached to said main body so that when said main body operatively engages said first probe, said U-shaped member has an inside leg downwardly extending from said main body toward said tip and an opposite outside leg upwardly extending away from said tip back toward said main body.

11. A return line assembly for a high frequency probe device comprising:
(a) a first probe having a first electrical conductor;
(b) a second probe having a second electrical conductor; and
(c) a sheet-like conductive strap electrically interconnecting said first electrical conductor and said second electrical conductor, at least an integral portion of said strap possessing sufficient self-coiling bias as to enable automatic retraction of said portion to a multicoiled position.

* * * * *

UNITED STATES PATENT AND TRADEMARK OFFICE
CERTIFICATE OF CORRECTION

PATENT NO. : 5,264,788

DATED : November 23, 1993

INVENTOR(S) : Kenneth R. Smith et al.

It is certified that error appears in the above-indentified patent and that said Letters Patent is hereby corrected as shown below:

Col. 4, line 24    Change "prob" to --probe in--

Col. 4, line 29    After "of" insert --the signal--

Col. 4, line 49    After "against" insert --the signal--

Col. 4, line 51    After "FIG." insert --9--

Col. 4, line 60    Change "FIG. is 10(a)" to --FIG. 10(a) is--

Col. 12, line 28   Delete "5"

Col. 14, line 58   After the word "detaches" delete the word "detach"

Signed and Sealed this

Twentieth Day of June, 1995

Attest:

BRUCE LEHMAN

Attesting Officer    Commissioner of Patents and Trademarks